United States Patent
Zhang et al.

(10) Patent No.: US 11,121,702 B1
(45) Date of Patent: Sep. 14, 2021

(54) DIGITAL STEP ATTENUATOR

(71) Applicant: Chengdu Sicore Semiconductor Corp. Ltd., Chengdu (CN)

(72) Inventors: Cemin Zhang, Chino, CA (US); Zhengwei Deng, Chengdu (CN)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 16/876,623

(22) Filed: May 18, 2020

(30) Foreign Application Priority Data

Apr. 7, 2020 (CN) .......................... 202010265811.X

(51) Int. Cl.
*H03H 11/24* (2006.01)
*H03H 7/24* (2006.01)
*H01P 1/22* (2006.01)
*H03H 7/25* (2006.01)

(52) U.S. Cl.
CPC .............. *H03H 11/245* (2013.01); *H01P 1/22* (2013.01); *H03H 7/24* (2013.01); *H03H 11/24* (2013.01); *H03H 7/251* (2013.01)

(58) Field of Classification Search
CPC ........ H03H 11/24; H03H 11/245; H03H 7/24; H03H 7/25; H03H 7/251; H01P 1/22
See application file for complete search history.

(56) References Cited

U.S. PATENT DOCUMENTS

| | | | |
|---|---|---|---|
| 5,448,207 A * | 9/1995 | Kohama | H03H 11/245 333/81 R |
| 8,779,870 B2 * | 7/2014 | Sun | H03H 7/07 333/81 R |
| 10,003,322 B2 | 6/2018 | Lam | |
| 10,277,201 B2 | 4/2019 | Lam | |

* cited by examiner

*Primary Examiner* — Dinh T Le
(74) *Attorney, Agent, or Firm* — North Weber & Baugh LLP; Michael V. North

(57) ABSTRACT

Various embodiments of the invention relate to attenuators with reduced temperature variation. By coordinating first-order resistance temperature (FORT) coefficients of resistors, embodiments of attenuator or attenuator cells are capable of achieving desired attenuation with reduced or minimized temperature variation. Such achievements in reducing temperature variation may be obtained without relying on resistors with large negative FORT coefficients. Attenuator cells may be configured as T-type attenuator cells, π-type attenuator cells, bridged-T attenuator cells, or shunt attenuators with various FORT coefficient combinations for the resistors incorporated within the attenuator cells. Furthermore, various attenuator cells may be cascaded together into a digital step attenuator with the temperature variation of those cells compensating or offsetting each other for an overall minimum temperature variation.

16 Claims, 8 Drawing Sheets

DIGITAL STEP ATTENUATOR

CROSS-REFERENCE TO RELATED APPLICATIONS

This application claims foreign priority to Chinese Patent Application No. 202010265811.X, entitled "DIGITAL STEP ATTENUATOR", naming Cemin Zhang and Zhengwei Deng as inventors, and filed Apr. 7, 2020, the subject matter of which is hereby incorporated herein by reference.

BACKGROUND

A. Technical Field

The present invention relates generally to an attenuator, and more particularly to an attenuator with reduced temperature variation.

B. Background of the Invention

An attenuator is an electronic device to reduce the power of a signal for gain control, power level adjustment, and/or impedance matching improvement. For radio frequency (RF) applications, it is desired that an attenuator reduces signal power in a wide frequency range without appreciably distorting the signal waveform.

Digital step attenuators (DSAs) are composed from multiple single-valued RF attenuators connected to provide for a selectable or programmable amount of attenuation in a circuit. A typical DSA comprises a series cascade of selectable single-valued RF attenuator cells, which may be a series-type attenuator or a shunt-type attenuator.

It is desirable for a DSA to have an attenuation constant with temperature changes. DSAs exhibit changes in electrical performance due to component variation as a function of temperature (both ambient and circuit induced). In actual conventional DSA implementations, the design components (e.g., transistors, resistors, and capacitors) which make up the DSA generally exhibit different electrical properties with temperature changes. The end result is relative attenuation error which varies with temperature.

Accordingly, there is a need for DSAs that have attenuation with reduced temperature variations for improved performance.

SUMMARY OF THE INVENTION

The invention discloses various embodiments of attenuators with reduced temperature variation for various RF applications. By coordinating first-order resistance temperature (FORT) coefficients of resistors, embodiments of attenuator or attenuator cells are capable of achieving desired attenuation with reduced or minimized temperature variation. Such achievements in reducing temperature variation may be obtained without relying on resistors with negative FORT coefficients. Attenuator cells may be configured as a T-type attenuator cells, a it-type attenuator cells, a bridged-T attenuator cells, or shunt attenuators with various FORT coefficient combinations for the resistors incorporated within the attenuator cells. Furthermore, various attenuator cells may be cascaded together into a digital step attenuator with the temperature variation of those cells compensating or offsetting each other for an overall minimum temperature variation.

Various embodiments of a T-type attenuator cell are disclosed. The T-type attenuator cell comprises a first series resistor and a second resistor coupled between an RF input port and an RF output port, and a shunt resistor coupled between a node interposed between the series resistors and ground. In one embodiment, all the resistors may have positive FORT coefficient, thus the attenuator cell may have minimum temperature variation for attenuation. In another embodiment, the series resistors may have positive FORT coefficients while the shunt resistor has a near zero FORT coefficient with an absolute value at least an order of magnitude smaller than the positive FORT coefficient. In one or more embodiments, such a resistor with positive FORT coefficient may be a salicided p-poly resistor with a FORT coefficient $TC1_{sal}$ around +3000 ppm/° C. In one or more embodiments, such a resistor with a near zero FORT efficient may be a low value unsalicided p-poly resistor with a FORT efficient $TC1_{LO}$ around −128 ppm/° C., which has an absolute value at least one order of magnitude smaller than the $TC1_{sal}$. By such configuration, the attenuator cell may have increasing attenuation dB values under increasing temperatures. Although $TC1_{sal}$ and $TC1_{LO}$ are used in one or more embodiments for positive FORT coefficient and near-zero FORT coefficient, one skilled in the art shall understand that resistors based on GaAs with various FORT coefficients may also be used for attenuator. Such an application is still within the scope of the present invention.

In another embodiment, the shunt resistor has a positive FORT coefficient while the series resistors may have near zero FORT coefficients with absolute value at least an order of magnitude smaller than the positive FORT coefficient of the shunt resistor. By such configuration, the attenuator cell may have decreasing attenuation dB values under increasing temperatures.

Various embodiments of a bridged-T attenuator cell are disclosed. The bridged-T attenuator cell comprises three resistors connected together to form a "T" configuration, with a first series resistor coupled to the RF input, a second series resistor coupled to the RF output, and a shunt resistor coupled between a node interposed between the series resistors and ground via a shunt switch. A bypass switch couples directly between the RF input port and the RF output port. The bypass switch and the shunt switch each have an ON resistance $R_{ON}$ with a positive FORT coefficient (for example, based on FIG. 4 and FIG. 6, $TC1_{SW}$ is comparable to $TC1_{sal}$). When the bridged-T attenuator cell is engaged for signal attenuation (e.g. the bypass switch is switched off and the shunt switch is switched on), the attenuation of the attenuator cell is mainly determined by the series resistors, the shunt resistor, and the shunt switch ON resistance $R_{ON}$. Depending on the FORT coefficients of the series resistors and the shunt resistor, the bridged-T attenuator cell may have attenuation with minimum temperature variations, attenuation decreasing with increasing temperatures, or attenuation increasing with increasing temperatures.

In one or more embodiments, an attenuator comprising multiple attenuator cells is disclosed. The attenuator comprises multiple attenuator cells, which may have a minimum temperature variation, or have a temperature variation in opposite direction with other attenuator cells. With the compensation or offset of the temperature variation among different attenuator cells, the overall temperature variation of the attenuator may be kept in a minimum or within a small range.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

Components, or modules, shown in diagrams are illustrative of exemplary embodiments of the invention and are meant to avoid obscuring the present disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

Figure 1:
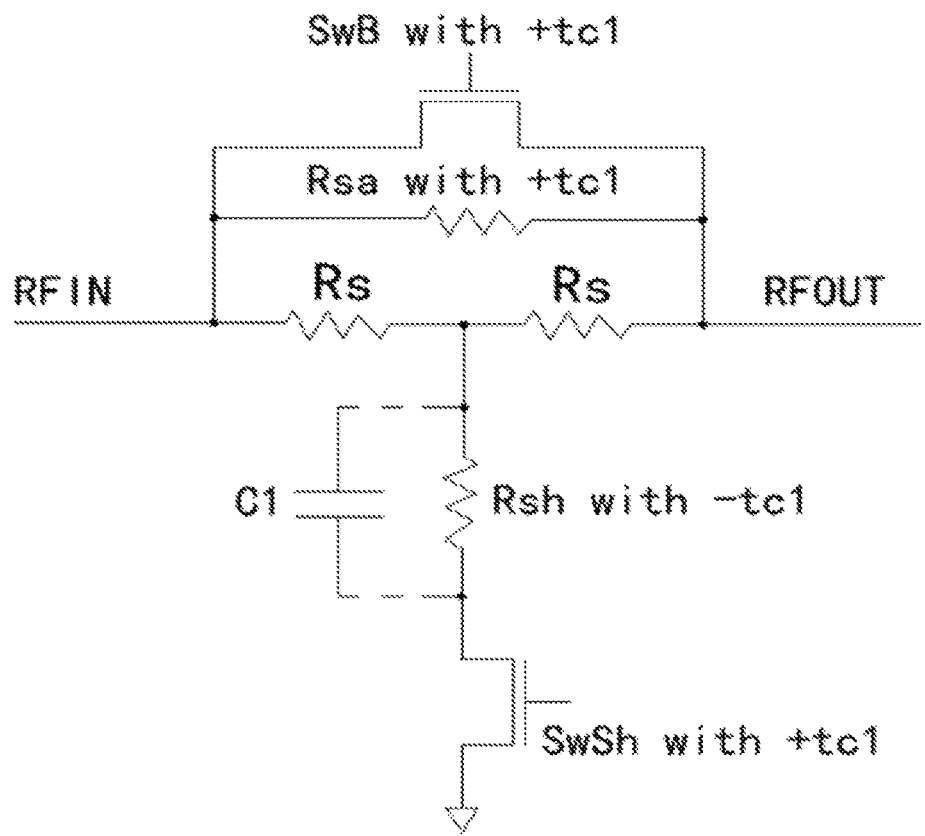
FIG. 1 depicts a schematic diagram of a prior art attenuator cell using multiple resistor elements having compensating first-order resistance temperature (FORT) coefficients.

U.S. Pat. No. 10,003,322 B2 discloses a series attenuator cell, shown in FIG. 1, using multiple resistor elements having compensating first-order resistance temperature (FORT) coefficients. The series attenuator cell is a Bridged-T attenuator cell comprising multiple resistor elements having compensating FORT coefficients. The transistor bypass switch SwB and the shunt switch SwSh each have an ON resistance ($R_{ON}$) with positive FORT coefficient, +tc1. The series resistor Rsa has a positive FORT coefficient (+tc1) and the shunt resistor Rsh has a complementary negative FORT coefficient (−tc1). The combination of a negative FORT coefficient resistor (Rsh) together with a positive FORT coefficient resistor (Rsa) compensates or offsets changes in the temperature-dependent $R_{ON}$ of the switches within the DSA cell. As temperature increases, the positive FORT coefficient of the series attenuating resistor Rsa causes an increase in the resistance of Rsa, which offsets the increase in the ON resistance $R_{ON}$ of the bypass switch SwB, so that the difference in attenuation between the attenuation state and the reference state remains approximately constant. In addition, the negative FORT coefficient of the shunt resistor Rsh causes a decrease in the resistance of Rsh with increasing temperature, thereby introducing more attenuation with respect to the increasing temperature during attenuation state, i.e., when the bypass switch SwB is OFF and SwSh is ON.

Figure 2:
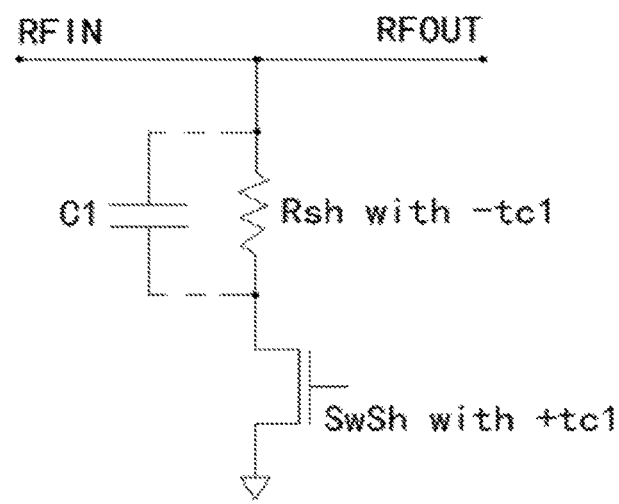
FIG. 2 depicts a schematic diagram of a prior art shunt DSA cell.

U.S. Pat. No. 10,003,322 B2 also discloses a schematic diagram of a prior art shunt DSA cell, shown in FIG. 2. Similar to FIG. 1, the shunt DSA cell comprises a shunt resistor Rsh with a negative FORT coefficient (-tc1) coupled to a transistor shunt switch SwSh having a positive FORT coefficient (+tc1) for its ON resistance $R_{ON}$. As temperature increases, the negative FORT coefficient of the shunt resistor Rsh causes a decrease in its resistance to offset the increase in the total ON resistance $R_{ON}$ of the shunt switch SwSh. Therefore, a more constant relative attenuation with changing temperature may be obtained.

One challenge for incorporating resistors with negative FORT coefficient to reduce temperature variation in DSAs is that such resistors may be very difficult or costly, if not impossible, to fabricated, given the requirements of resistor size, resistance value, desired FORT coefficient, etc. Therefore, the economical or practical application for incorporating resistors with negative FORT coefficient in DSAs is limited.

Figure 3:
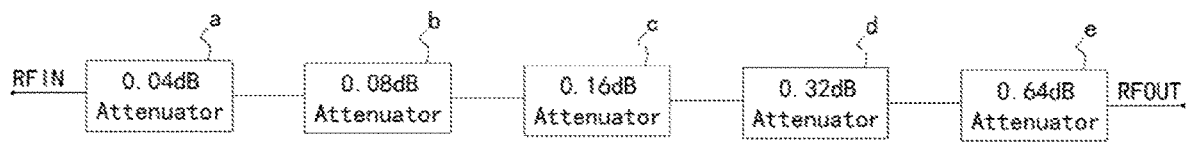
FIG. 3 depicts a block diagram of a prior art DSA having selectable attenuator cells.

FIG. 3 depicts a block diagram of a prior art DSA having selectable attenuator cells, with attenuation values including 0.04 dB, 0.08 dB, 0.16 dB, 0.32 dB, and 0.64 dB, coupled between RF input port and RF output port. The DSA has multiple selectable attenuator cells, which may be selected using any of 32 binary-coded combinations by external control circuitry to provide different attenuation states. The coding schemes may be binary coding, thermometer coding, or a hybrid thermometer and binary coding. The requirement for external control circuit for thermometer coding adds complexity and cost to the DSA, and thus also limits its application.

Figure 4:
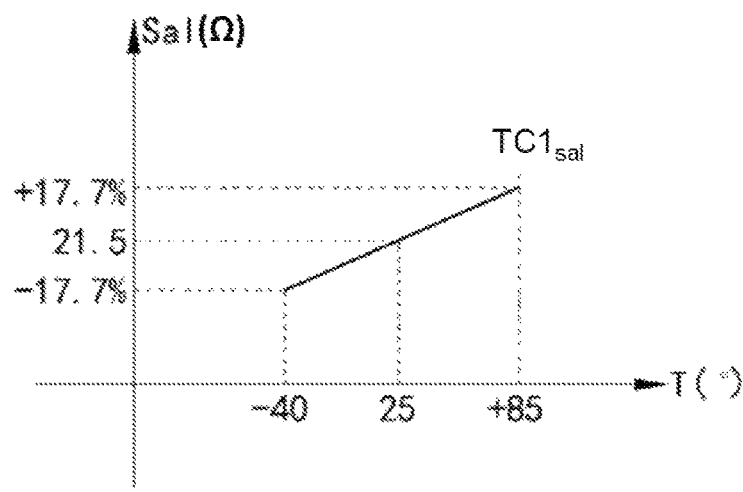
FIG. 4 depicts a resistance diagram of a resistor with a positive FORT coefficient.

FIG. 4 depicts an exemplary resistance diagram of a resistor $R_{sal}$ with a FORT coefficient $TC1_{sal}$ with a large positive value, e.g. +3000 ppm/° C. The resistance value of the resistor $R_{sal}$ is 21.5Ω under room temperature (25° C.) and may increase or decrease 17.7% when the temperature is increased to 85° C. or lowered to −40° C.

Figure 5:
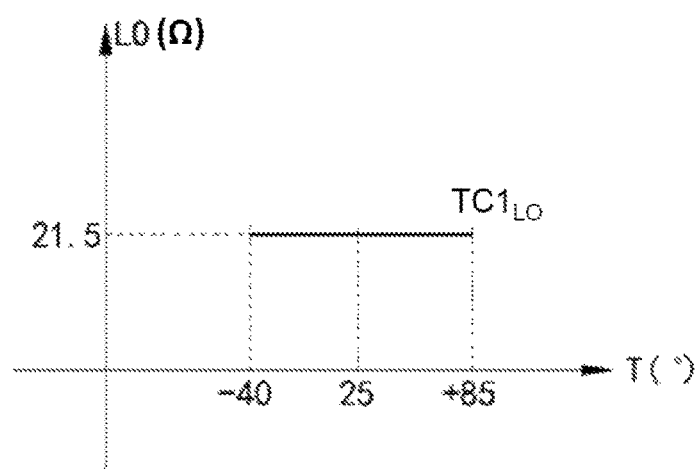
FIG. 5 depicts a resistance diagram of a resistor with a near zero FORT coefficient.

FIG. 5 depicts a resistance diagram of a resistor $R_{LO}$ with a FORT coefficient $TC1_{LO}$ with an absolute value at least an order of magnitude smaller than the $TC1_{sal}$, e.g. −128 ppm/° C. The resistance value of the resistor $R_{LO}$ remains around 21.5Ω when the temperature varies between −40° C. and 85° C.

Figure 6:
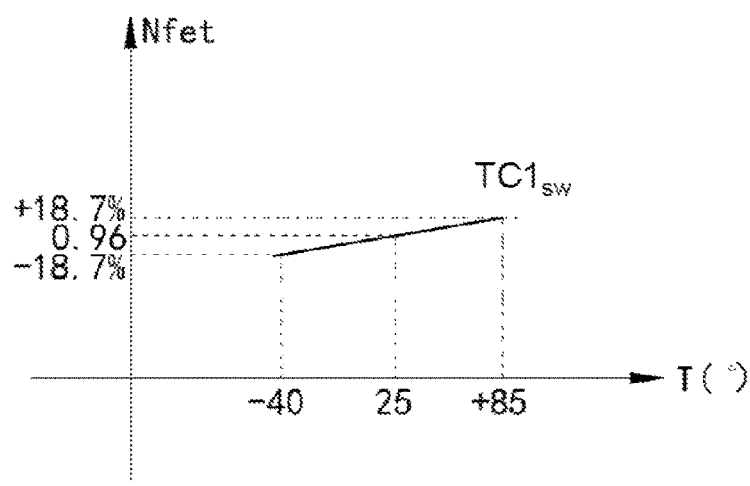
FIG. 6 depicts an ON resistance $R_{ON}$ of a switch having a positive FORT coefficient.

FIG. 6 depicts an ON resistance $R_{ON}$ of a switch having a positive FORT coefficient $TC1_{SW}$. Typically, a semiconductor switch, such as a field effect transistor (FET), has an ON resistance $R_{ON}$ with a positive FORT coefficient $TC1_{SW}$. Given such a positive FORT coefficient for the $R_{ON}$, a DSA comprising multiple switches may have an undesired temperature dependent attenuation variation if no measures are applied to compensate or offset the temperature variation of the ON resistance $R_{ON}$.

Embodiment 1

Figure 7:
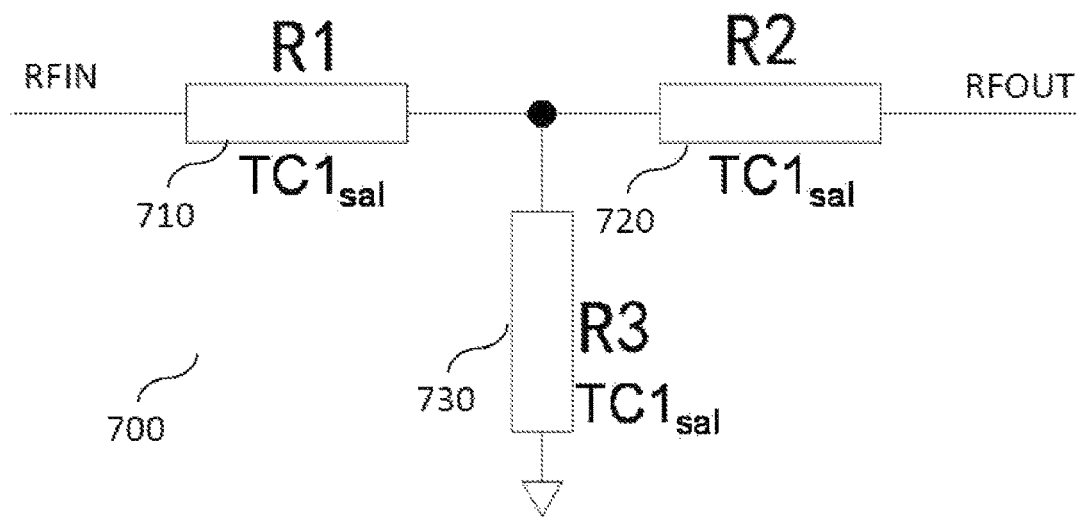
FIG. 7 depicts a T-type attenuator cell comprising resistors all having positive FORT coefficient according to embodiment 1 of the present invention.

FIG. 7 depicts a T-type attenuator cell 700 comprising resistors all having positive FORT coefficients (+tc1) according to embodiment 1 of the present invention. The T-type attenuator cell 700 comprises three resistors connected together to form a "T" configuration, with a first series resistor 710 coupled to the RF input, a second series resistor 720 coupled to the RF output, and a shunt resistor 730 coupled between a node interposed between the series resistors and ground. The first series resistor 710 and the second series resistor 720 may or may not have the same resistance value. All three resistors have positive FORT coefficients, which may or may not be the same.

Figure 8:
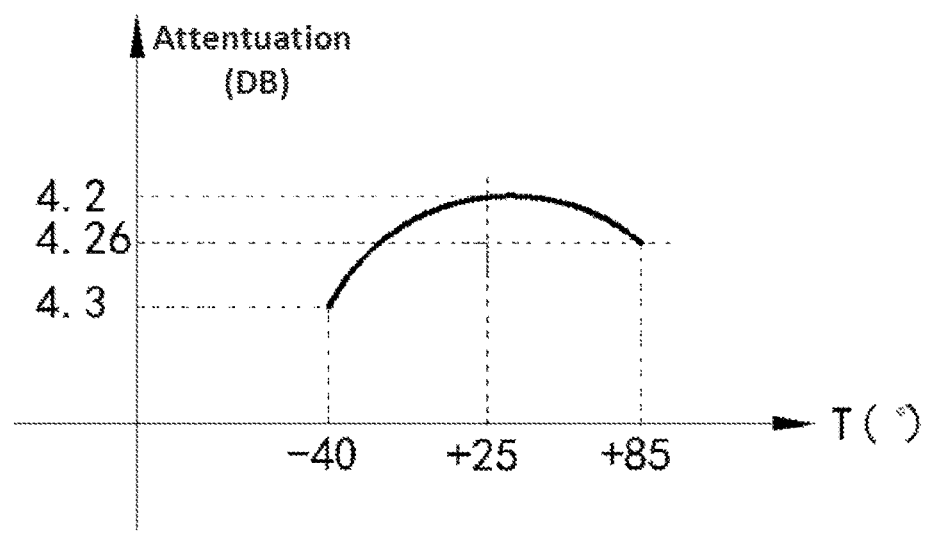
FIG. 8 depicts an attenuation diagram of the T-type attenuator cell comprising resistors all having positive FORT coefficient according to embodiment 1 of the present invention.

FIG. 8 depicts an attenuation diagram of the T-type attenuator cell 700 according to embodiment 1 of the present invention. As shown in FIG. 8, the attenuation in dB changes from 4.3 to 4.2 (only 2.3% change) when the temperature rises from −40° C. and +85° C. The relative small variation in the attenuation demonstrates that without relying on resistor having negative FORT coefficients, a DSA may still achieve a small temperature variation.

Embodiment 2

Figure 9:
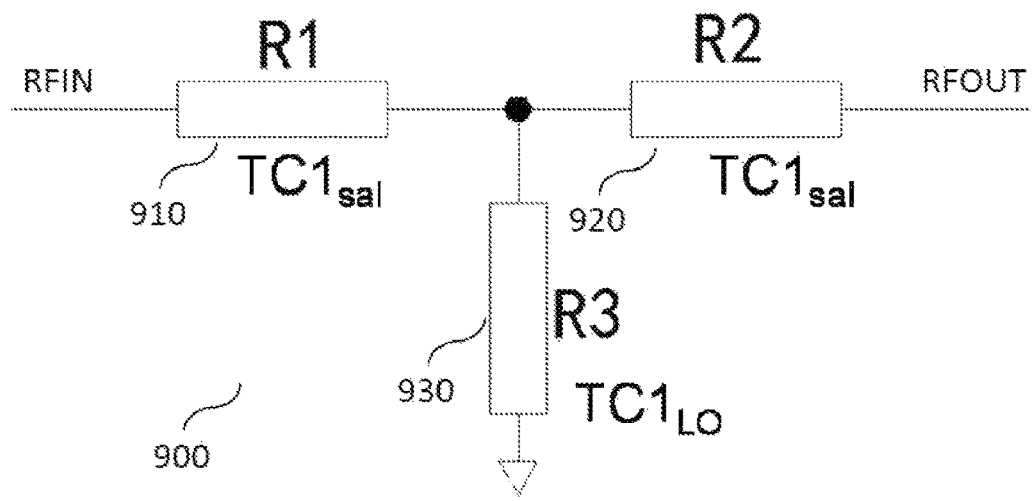
FIG. 9 depicts a T-type attenuator cell comprising resistors with various FORT coefficients according to embodiment 2 of the present invention.

FIG. 9 depicts a T-type attenuator cell 900 comprising resistors having various coefficients according to embodiment 2 of the present invention. The T-type attenuator cell 900 comprises three resistors connected together to form a "T" configuration, with a first series resistor 910 coupled to the RF input, a second series resistor 920 coupled to the RF output, and a shunt resistor 930 coupled between a node interposed between the series resistors and ground. The first series resistor 910 and the second series resistor 920 have coefficients ($TC1_{sal}$) with positive values, while the shunt resistor has a FORT coefficient ($TC1_{LO}$) with an absolute value at least an order of magnitude smaller than the coefficients of the series resistors. In other words, the FORT coefficient ($TC1_{LO}$) of the shut resistor may be near zero compared to the coefficients $TC1_{sal}$. The resistance values for the three resistors may or may not be the same.

Figure 10:
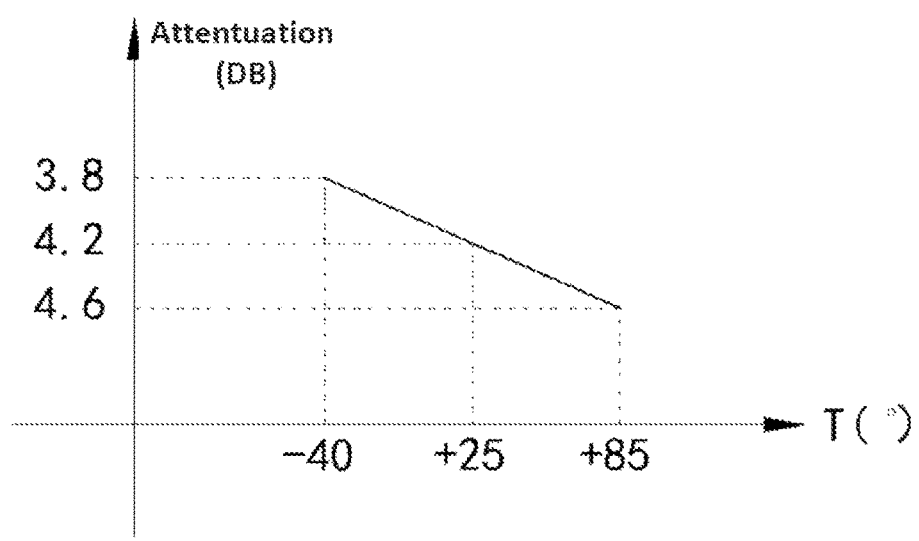
FIG. 10 depicts an attenuation diagram of the T-type attenuator cell comprising resistors with various FORT coefficients according to embodiment 2 of the present invention.

FIG. 10 depicts an attenuation diagram of the T-type attenuator cell 900 according to embodiment 2 of the present invention. As shown in FIG. 10, the attenuation in dB increases from 3.8 to 4.6 (a significant 21% change as compared to FIG. 8) when the temperature rises from −40° C. and 85° C.

Embodiment 3

Figure 11:
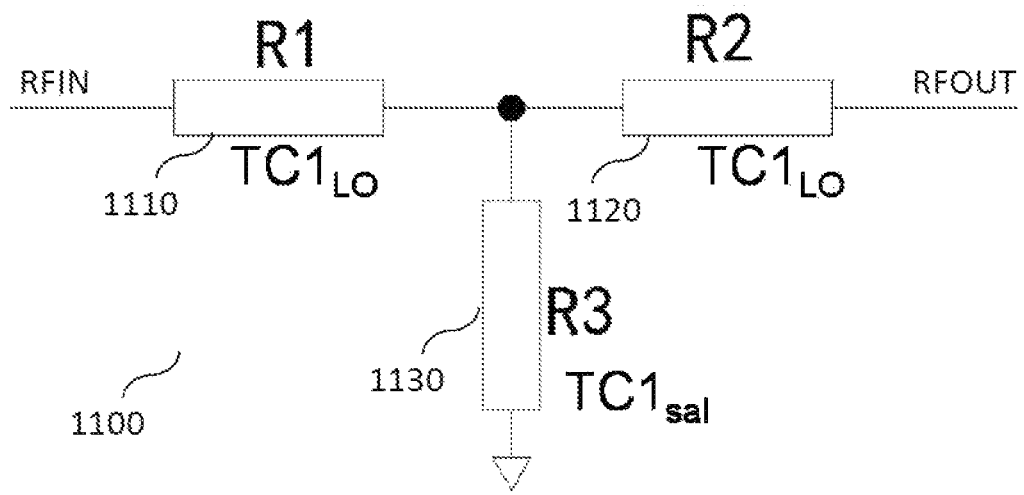
FIG. 11 depicts an alternative T-type attenuator cell comprising resistors with various FORT coefficients according to embodiment 3 of the present invention.

FIG. 11 depicts an alternative T-type attenuator cell 1100 comprising resistors with various FORT coefficients according to embodiment 3 of the present invention. The T-type attenuator cell 1100 comprises three resistors connected together to form a "T" configuration, with a first series resistor 1110 coupled to the RF input, a second series resistor 1120 coupled to the RF output, and a shunt resistor 1130 coupled between a node interposed between the series resistors and ground. The shunt resistor has a positive FORT coefficient ($TC1_{sal}$), while the first series resistor 1110 and the second series resistor 1120 each has a coefficient ($TC1_{LO}$) with an absolute value at least one order of magnitude smaller than the $TC1_{sal}$. The resistance values for the three resistors may or may not be the same.

Figure 12:
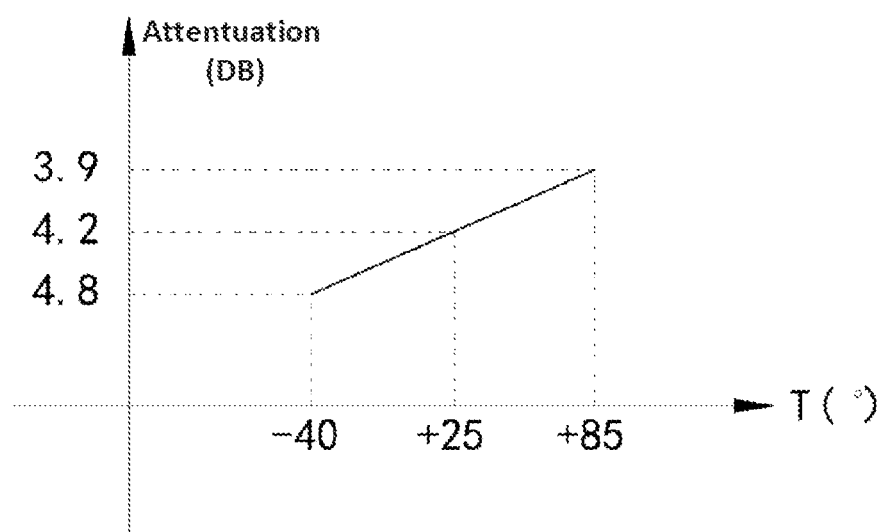
FIG. 12 depicts an attenuation diagram of the alternative T-type attenuator cell comprising resistors with various FORT coefficients according to embodiment 3 of the present invention.

FIG. 12 depicts an attenuation diagram of the alternative T-type attenuator cell 1100 according to embodiment 3 of the present invention. As shown in FIG. 12, the attenuation in dB decreases from 4.8 to 3.9 (a significant 18.8% change) when the temperature rises from −40° C. and 85° C. It shall be noted that the variation trend of attenuation in FIG. 12 is in an opposite direction to the variation trend of attenuation in FIG. 10. Such an opposition may be utilized to reduce temperature variation when the T-type attenuator cell 900 in the embodiment 2 and the T-type attenuator cell 1100 are cascaded together to offset or compensate each other.

Embodiment 4

Figure 13:
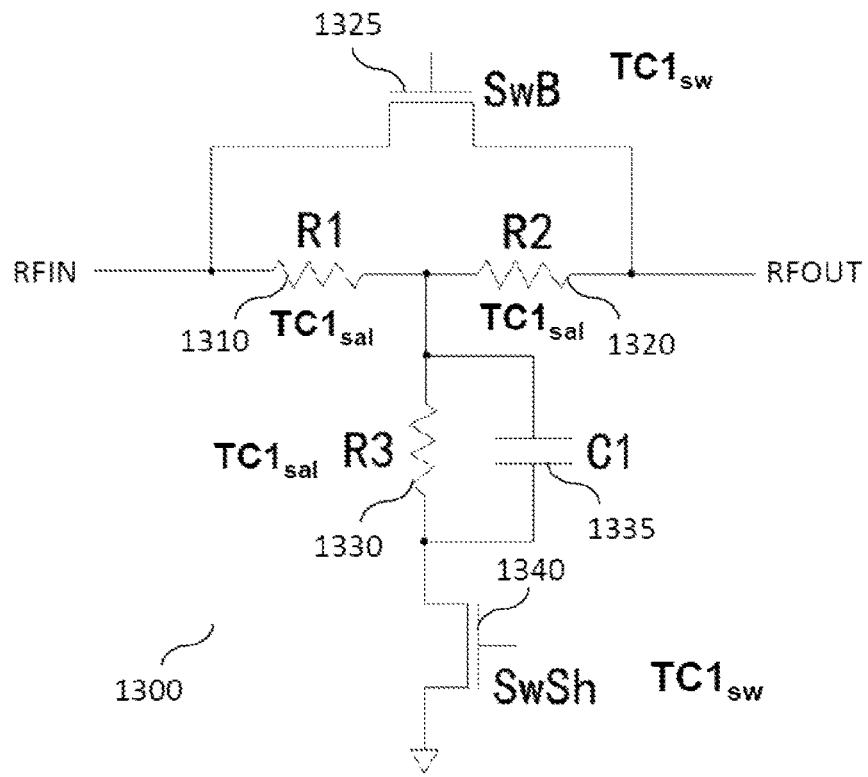
FIG. 13 depicts a diagram of a bridged-T attenuator cell comprising resistors with positive FORT coefficients according to embodiment 4 of the present invention.

FIG. 13 depicts a diagram of a bridged-T attenuator cell 1300 according to embodiment 4 of the present invention.

Similar to the attenuator cell T-type 700 in the embodiment 1, the bridged-T attenuator cell 1300 comprises resistors having positive FORT coefficients ($TC1_{sal}$). The bridged-T attenuator cell 1300 comprises three resistors connected together to form a "T" configuration, with a first series resistor R1 1310 coupled to the RF input, a second series resistor R2 1320 coupled to the RF output, and a shunt resistor R3 1330 coupled between a node interposed between the series resistors and ground via a shunt switch (SwSh) 1340. A bypass switch (SwB) 1325 couples directly between the RF input port and the RF output port. The bypass switch 1325 and the shunt switch 1340 each have an ON resistance $R_{ON}$ with a positive FORT coefficient $TC1_{SW}$. In one or more embodiments, a capacitor C1 1335 is coupled in parallel with the shunt resistor 1330 to minimize the impact of the parasitic capacitance from the shunt switch 1340 and the bypass switch 1325, and also to improve matching between the bridged-T attenuator cell 1300 to other attenuator cells. In one or more embodiments, the first series resistor 1310 and the second series resistor 1320 may or may not have the same resistance value. All three resistors have positive FORT coefficients, which may or may not be the same.

When the bridged-T attenuator cell 1300 is engaged for attenuation (e.g. the bypass switch 1325 is switched off and the shunt switch 1340 is switched on), the attenuation of the bridged-T attenuator cell 1300 is mainly determined by the series resistors, the shunt resistor, and the shunt switch ON resistance $R_{ON}$. The overall temperature variation of the bridged-T attenuator cell 1300 may be similar to the temperature variation shown in FIG. 8. In other words, the temperature variation may be very small without relying on a complementary resistor with a negative FORT coefficient for compensation.

Embodiment 5

Figure 14:
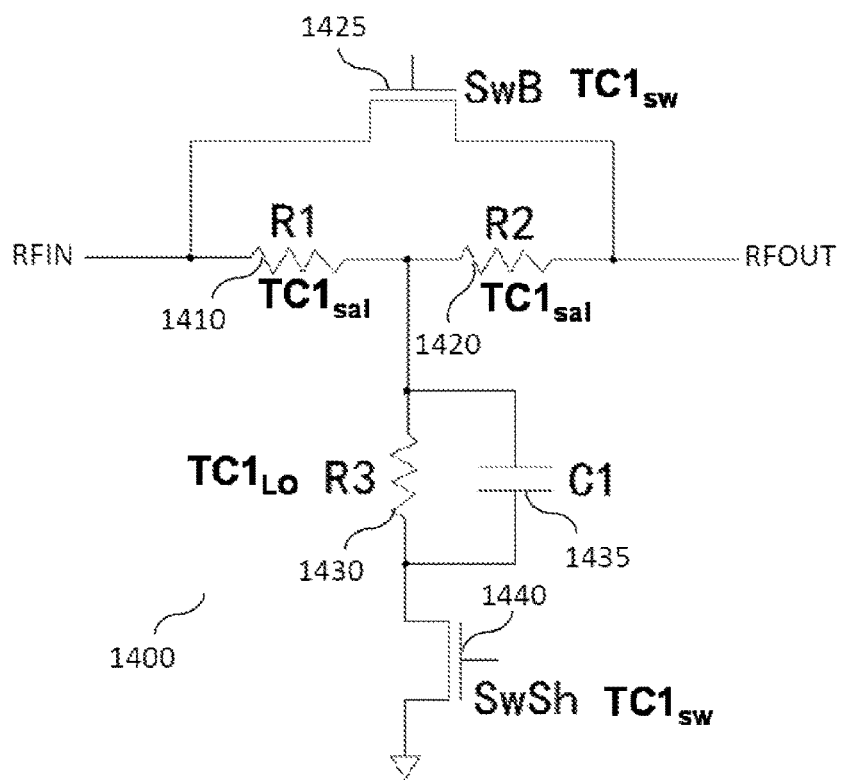
FIG. 14 depicts a diagram of an alternative bridged-T attenuator cell comprising resistors with various FORT coefficients according to embodiment 5 of the present invention.

FIG. 14 depicts a diagram of an alternative bridged-T attenuator cell 1400 comprising resistors with various FORT coefficients according to embodiment 5 of the present invention. Similar to the T-type attenuator cell 900 in the embodiment 2, the bridged-T attenuator cell 1400 comprises three resistors connected together to form a "T" configuration, with a first series resistor R1 1410 coupled to the RF input, a second series resistor R2 1420 coupled to the RF output, and a shunt resistor R3 1430 coupled between a node interposed between the series resistors and ground via a shunt switch (SwSh) 1440. The first series resistor 1410 and the second series resistor 1420 have positive coefficients ($TC1_{sal}$), while the shunt resistor 1430 has a FORT coefficient ($TC1_{LO}$) with an absolute value at least an order of magnitude smaller than the positive coefficients $TC1_{sal}$. The resistance values for the three resistors may or may not be the same. A bypass switch (SwB) 1425 couples directly between the RF input port and the RF output port. The bypass switch 1425 and the shunt switch 1440 each have an ON resistance $R_{ON}$ with a positive FORT coefficient $TC1_{SW}$. In one or more embodiments, a capacitor C1 1435 is coupled in parallel with the shunt resistor 1430 to minimize the impact of the parasitic capacitance from the shunt switch 1440 and the bypass switch 1425, and also to improve matching between the bridged-T attenuator cell 1400 to other attenuator cells. In one or more embodiments, the first series resistor 1410 and the second series resistor 1420 may or may not have the same FORT coefficients.

When the bridged-T attenuator cell 1400 is engaged for attenuation (e.g. the bypass switch 1425 is switched off and the shunt switch 1440 is switched on), the attenuation of the bridged-T attenuator cell 1400 is mainly determined by the series resistors, the shunt resistor, and the shunt switch ON resistance $R_{ON}$. Since the shunt resistor 1430 has a FORT coefficient ($TC1_{LO}$) at least one order of magnitude smaller than $TC1_{sal}$, the FORT coefficients ($TC1_{sal}$) of the first series resistor 1410 and the second series resistor 1420 have a dominant role in determining the attenuation variations at different temperatures. In one or more embodiments, the shunt resistor 1430 may be designated to have a resistance much larger than the ON resistance $R_{ON}$ of the shunt switch SwSh 1440, such that the positive FORT coefficient $TC1_{SW}$ of the shunt switch SwSh 1440 has minimum or negligible impact to the performance of the bridged-T attenuator cell 1400. The overall attention dB of the bridged-T attenuator cell 1400 increases as temperature increases; and the attenuation variation slope may be adjusted by adjusting or choosing desired resistance values for the shunt resistor 1430, and/or the ON resistance $R_{ON}$ of the shunt switch SwSh 1440.

Embodiment 6

Figure 15:
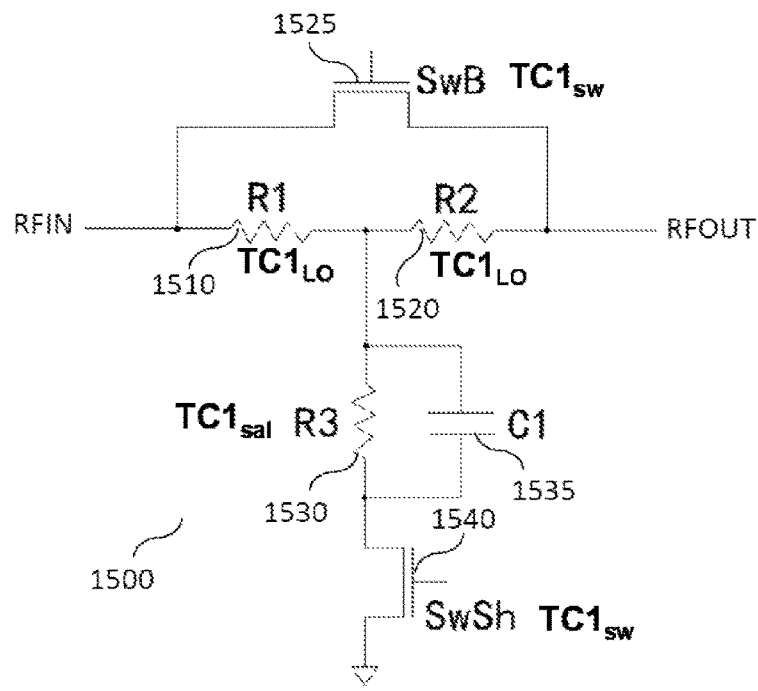
FIG. 15 depicts a diagram of another alternative bridged-T attenuator cell comprising resistors with various FORT coefficients according to embodiment 6 of the present invention.

FIG. 15 depicts a diagram of another alternative bridged-T attenuator cell 1500 according to embodiment 6 of the present invention. Similar to the attenuator cell 1100 in the embodiment 3, the bridged-T attenuator cell 1500 comprises three resistors connected together to form a "T" configuration, with a first series resistor R1 1510 coupled to the RF input, a second series resistor R2 1520 coupled to the RF output, and a shunt resistor R3 1530 coupled between a node interposed between the series resistors and ground via a shunt switch (SwSh) 1540. The shunt resistor 1530 has a positive coefficient ($TC1_{sal}$), while the first series resistor 1510 and the second series resistor 1520 each has a coefficient ($TC1_{LO}$) with absolute value at least one order of magnitude smaller than the positive coefficient ($TC1_{sal}$). The resistance values for the three resistors may or may not be the same. A bypass switch (SwB) 1525 couples directly between the RF input port and the RF output port. The bypass switch 1525 and the shunt switch 1540 each have an ON resistance Rory with a positive FORT coefficient $TC1_{SW}$. In one or more embodiments, a capacitor C1 1535 is coupled in parallel with the shunt resistor 1530 to minimize the impact of the parasitic capacitance from the shunt switch 1540 and the bypass switch 1525, and also to improve matching between the bridged-T attenuator cell 1500 to other attenuator cells. In one or more embodiments, the first series resistor 1510 and the second series resistor 1520 may or may not have the same FORT coefficients.

When the bypass switch 1525 is switched on, the bridged-T attenuator cell 1500 may be bypassed (the RF signal is only attenuated due to the ON resistance $R_{ON}$ of the bypass switch SwB 1525). When the bridged-T attenuator cell 1500 is engaged for attenuation (e.g. the bypass switch 1525 is switched off and the shunt switch 1540 is switched on), the attenuation of the bridged-T attenuator cell 1500 is mainly determined by the series resistors, the shunt resistor, and the shunt switch ON resistance $R_{ON}$. Since the first series resistor 1510 and the second series resistor 1520 have FORT coefficients ($TC1_{LO}$) with much smaller value compared to the positive coefficient ($TC1_{sal}$), the FORT coefficients ($TC1_{sal}$) of the shunt resistor 1530 has a dominant role in determining the attenuation variations at different temperatures. The attention dB of the attenuator cell 1500 decreases as temperature increases; and the decreasing variation slope may be adjusted by adjusting or choosing desired resistance values for the first series resistor 1510 and the second series resistor 1520, and/or the ON resistance $R_{ON}$ of the bypass switch SwB 1525.

Embodiment 7

Figure 16:
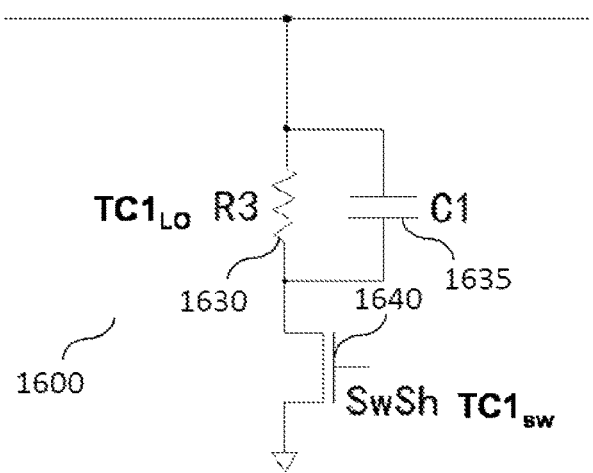
FIG. 16 depicts a diagram of a shunt attenuator cell comprising one or more resistors according to embodiment 7 of the present invention.

FIG. 16 depicts a diagram of a shunt attenuator cell 1600 comprising one or more resistors according to embodiment 7 of the present invention. The shunt attenuator cell 1600 comprises a transistor shunt switch SwSh 1640 having a positive FORT coefficient ($TC1_{SW}$) for its ON resistance Rory and a shunt resistor R3 1630 coupled to the shunt switch 1640. The shunt resistor R3 1630 has a FORT coefficient ($TC1_{LO}$) with an absolute value at least one order of magnitude smaller than the FORT coefficients ($TC1_{SW}$) of the ON resistance $R_{ON}$ of the shunt switch SwSh 1640. Therefore, the shunt switch SwSh 1640 has a dominant role in determining the attenuation variations at different temperatures. The attention dB of the shunt attenuator cell 1600 decreases as temperature increases; and the decreasing variation slope may be adjusted by adjusting or choosing desired resistance values for the shunt resistor 1630, and/or the ON resistance $R_{ON}$ of the shunt switch SwSh 1640. In one or more embodiments, a capacitor C1 1635 is coupled in parallel with the shunt resistor 1630 to minimize the impact of the parasitic capacitance from the shunt switch 1640, and also to improve matching between the shunt attenuator cell 1600 to other attenuator cells.

Embodiment 8

Figure 17:
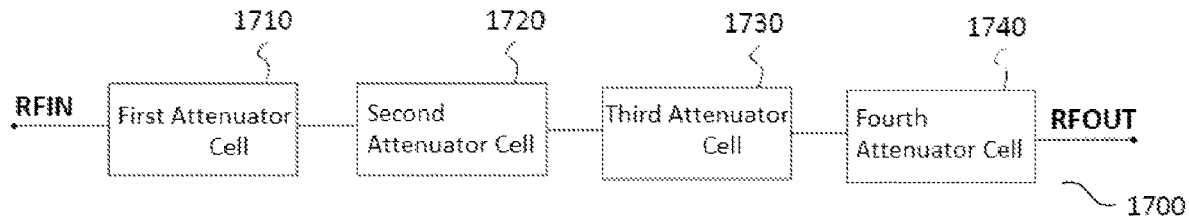
FIG. 17 depicts a block diagram of a DSA comprising multiple attenuator cells according to embodiment 8 of the present invention.

It shall be noted that differences in attenuation variation slope for the bridged-T attenuator cell 1400 in the embodiment 5, the bridged-T attenuator cell 1500 in the embodiment 6, and the shunt attenuator cell 1600 in the embodiment 7 may be utilized to reduce temperature variation when those attenuator cells are combined to offset or compensate each other. FIG. 17 depicts a block diagram of a DSA 1700 comprising multiple attenuator cells according to embodiment 8 of the present invention. As shown in FIG. 17, the DSA comprises a first attenuator cell 1710, a second attenuator cell 1720, a third attenuator cell 1730, and a fourth attenuator cell 1740. These four attenuator cells may respectively correspond to the bridged-T attenuator cell 1300 in the embodiment 4, the bridged-T attenuator cell 1400 in the embodiment 5, the bridged-T attenuator cell 1500 in the embodiment 6, and the shunt attenuator cell 1600 in the embodiment 7. Since the first attenuator cell 1710 inherently has a minimum temperature variation, and the second attenuator cell 1720 has a temperature variation in opposite direction with the third attenuator cell 1730, and the fourth attenuator cell 1740, the overall temperature variation of the DSA 1700 may be lowered to a minimum value or be kept within a small range.

The foregoing description of the invention has been described for purposes of clarity and understanding. It is not intended to limit the invention to the precise form disclosed. Various modifications may be possible within the scope and equivalence of the appended claims. For example, a resistor in various embodiments of the present invention may be a single resistor, or a combination of resistors connected in parallel, e.g. a single resistor with a positive FORT coefficient and a single resistor with a near-zero FORT coefficient, for a desired overall FORT coefficient. The bypass switch or shunt switch may be a single switch or cascaded switches.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims may be arranged differently including having multiple dependencies, configurations, and combinations. For example, in embodiments, the subject matter of various claims may be combined with other claims.

The invention claimed is:

1. A digital step attenuator comprising:
   a first resistor and a second resistor coupled in series between an RF input port and an RF output port, the first resistor and the second resistor each has a first-order resistance temperature (FORT) coefficient with a positive value;
   a shunt resistor coupled to a node interposed between the first resistor and the second resistor, the shunt resistor has a FORT coefficient with an absolute value at least one order of magnitude smaller than the positive value for the FORT coefficient of the first resistor and the positive value for the FORT coefficient of the second resistor;
   a shunt switch coupled between the shunt resistor and a ground; and
   a bypass switch coupled between the RF input port and the RF output port, the attenuator is engaged for signal attenuation when the bypass switch is switched off and the shunt switch is switch on.

2. The digital step attenuator of claim 1 wherein the first resistor, the second resistor, and the shunt resistor all have positive FORT coefficients.

3. The digital step attenuator of claim 1 further comprising:
   a capacitor coupled in parallel with the shunt resistor.

4. The digital step attenuator of claim 2 wherein the FORT coefficients for the first resistor and the second resistor have the same value.

5. The digital step attenuator of claim 1 wherein the shunt switch and the bypass switch each have an ON resistance with a positive FORT coefficient.

6. The digital step attenuator of claim 3 wherein the first resistor and the second resistor have the same resistance value.

7. A digital step attenuator comprising:
   a first resistor and a second resistor coupled in series between an RF input port and an RF output port, the first resistor and the second resistor each has a first-order resistance temperature (FORT) coefficient;
   a shunt resistor coupled to a node interposed between the first resistor and the second resistor;
   a shunt switch coupled between the shunt resistor and a ground; and
   a bypass switch coupled between the RF input port and the RF output port, the attenuator is engaged for signal attenuation when the bypass switch is switched off and the shunt switch is switch on;
   wherein the FORT coefficient of the shunt resistor has a positive value, each of the FORT coefficients of the first resistor and the second resistor have an absolute value at least one order of magnitude smaller than the positive value for the FORT coefficient of the shunt resistor.

8. A digital step attenuator comprising:
one or more attenuator cells coupled in series between an RF input port and an RF output port, each attenuator cell comprising:
  a first resistor and a second resistor coupled in series; and
  a first shunt resistor coupled to a node interposed between the first resistor and the second resistor, the first resistor, the second resistor, and the first shunt resistor each have a first-order resistance temperature (FORT) coefficient;
a shunt attenuator cell coupled in series with the one or more attenuator cells, the shunt attenuator cell comprising:
  a second shunt resistor;
  a shunt switch coupled between the second shunt resistor and ground, the shunt switch has an ON resistance with a positive FORT coefficient.

9. The digital step attenuator of claim 8 wherein each attenuator cell further comprising:
  a first shunt switch coupled between the first shunt resistor and ground; and
  a bypass switch coupled in parallel with the first resistor and the second resistor, the attenuator cell is engaged for signal attenuation when the bypass switch is switched off and the first shunt switch is switch on.

10. The digital step attenuator of claim 9 wherein the one or more attenuator cells comprise one attenuator cell with the first resistor, the second resistor, and the shunt resistor all having FORT coefficients with the positive value.

11. The digital step attenuator of claim 9 wherein the shunt switch and the bypass switch each have an ON resistance with a positive FORT coefficient.

12. The digital step attenuator of claim 8 wherein the shunt resistor in the shunt attenuator cell has a FORT coefficient with an absolute value at least one order of magnitude smaller than the positive FORT coefficient of the ON resistance of the shunt switch.

13. A digital step attenuator comprising:
  a first attenuator cell comprising one or more resistors, the first attenuator cell has an attenuation increasing with temperature; and
  a second attenuator cell coupled in series to the first attenuation cell, the second attenuator cell comprising one or more resistors, the second attenuator cell has an attenuation decreasing with temperature to compensate the first attenuator cell such that an overall temperature variation of the attenuator is lowered.

14. The digital step attenuator of claim 13 wherein the first attenuator cell comprising:
  a first resistor and a second resistor coupled in series; and
  a first shunt resistor coupled to a node interposed between the first resistor and the second resistor, the first shunt resistor has a positive first-order resistance temperature (FORT) coefficient;
  wherein the first resistor and the second resistor each have a FORT coefficient with an absolute value at least one order of magnitude smaller than the positive FORT coefficient of the first shunt resistor.

15. The digital step attenuator of claim 14 wherein the second attenuator cell comprising:
  a third resistor and a fourth resistor coupled in series, the third resistor and the fourth resistor each have a positive FORT coefficients; and
  a second shunt resistor coupled to a node interposed between the third resistor and the fourth resistor, the second shunt resistor has a FORT coefficient with an absolute value at least one order of magnitude smaller than the positive FORT coefficients of the first resistor and the second resistor.

16. The digital step attenuator of claim 13 further comprising:
  a third first attenuator cell coupled in series with the first attenuator cell and the second attenuator cell, the third first attenuator cell comprising:
    a fifth resistor and a sixth resistor coupled in series; and
    a third shunt resistor coupled between a node interposed between the fifth and the sixth resistors, the fifth resistor, the sixth resistor and the third shunt resistor all have positive first-order resistance temperature (FORT) coefficients.

\* \* \* \* \*